United States Patent [19]

Clark

[11] 3,812,405

[45] May 21, 1974

[54] STABLE THYRISTOR DEVICE

[75] Inventor: Lowell Eugene Clark, Scottsdale, Ariz.

[73] Assignee: Motorola, Inc., Phoenix, Ariz.

[22] Filed: Jan. 29, 1973

[21] Appl. No.: 327,366

[52] U.S. Cl. ...... 317/235 AB, 307/252 A, 307/279, 307/324, 307/303, 307/305, 317/235 R, 317/235 A

[51] Int. Cl. ........................................... H01l 11/10

[58] Field of Search ..... 317/235 AB, 235 C, 235 D, 317/235 A, 235 D; 307/303, 305, 252 A, 279, 284, 324

[56] References Cited

UNITED STATES PATENTS

| | | | |
|---|---|---|---|
| 3,238,384 | 3/1966 | Lewis | 307/88.5 |
| 3,243,669 | 3/1966 | Sah | 317/234 |
| 3,264,493 | 8/1966 | Price | 307/88.5 |
| 3,293,087 | 12/1966 | Porter | 148/175 |
| 3,313,998 | 4/1967 | Bunker | 321/44 |
| 3,434,015 | 3/1969 | Kilby | 317/101 |
| 3,502,952 | 3/1970 | Hierhoczen | 317/235 |
| 3,553,541 | 1/1971 | King | 317/235 |
| 3,571,630 | 3/1971 | Widlar | 307/302 |
| 3,609,413 | 9/1971 | Lane et al. | 307/305 |
| 3,621,293 | 11/1971 | Heidtmann | 307/252 |
| 3,713,908 | 1/1973 | Agusta et al. | 148/175 |
| 3,746,890 | 7/1973 | Walker | 307/293 |

OTHER PUBLICATIONS

T. Collins, "Transistor–Collector Clamp," I.B.M. Tech. Discl. Bull., Vol. 10, No. 2, July 1967, p. 180.

M. Cowan et al., "Compat. Lat. PNP and Double–Diffused NPN Device," IBM Tech. Discl. Bull., Vol. 13, No. 4, Sept. 1970, pp. 939–940.

H. Berger et al., "Producing Reduced Inverse Beta Transitors," IBM Tech. Discl. Bull., Vol. 14, No. 3, Aug. 1971, pp. 752&753.

*Primary Examiner*—Rudolph V. Rolinec
*Assistant Examiner*—Joseph E. Clawson, Jr.
*Attorney, Agent, or Firm*—Vincent J. Rauner; Charles R. Hoffman

[57] ABSTRACT

A two-terminal thyristor device including a thyristor combined with a field effect transistor having a firing voltage that is dependent upon the pinch-off voltage of the field effect transistor. The field effect transistor is connected to reverse bias the PNP emitter-base junction until the applied voltage increases to the value at which the field effect transistor becomes pinched off. At this point the product of the PNP gain and NPN gain is greater than unity, and the device switches to a conducting mode. The field effect transistor establishes the holding current in the conduction mode for the switching device.

7 Claims, 12 Drawing Figures

(a)

(b)

(a)

(b)

STABLE THYRISTOR DEVICE

BACKGROUND OF THE INVENTION

1. Field of the Invention

This invention relates to thyristors and more particularly to two-terminal thyristor devices having high holding currents and stable firing voltages.

2. Description of the Prior Art

In the prior art two-terminal thyristors are controlled by the voltage applied between the anode and cathode terminals. When the gain product of the PNP and NPN sections reaches unity, the thyristor switches to its conduction mode. The low-current gains of the PNP and NPN sections are strongly dependent on the respective collector currents, and are also dependent on temperature and various manufacturing variables and material properties. The low currents which flow prior to breakover are the collector-base leakage currents of the PNP and NPN sections, and are strongly dependent on temperature and manufacturing variables and material properties. Therefore, the breakover voltages of prior art thyristors are unstable. Further, the prior art thyristors have very low, unstable values of holding current, which is the anode current at which the aforementioned gain product is unity. However, for many applications stable breakover voltages and high holding currents are required. Approaches to providing increased holding currents in prior art thyristors include providing low gain transistor sections, such as lateral PNP sections, or by gold doping the base regions to reduce gain. However, these approaches have often provided unreproducible results.

The present invention solves the above-mentioned shortcomings of the prior art by providing a two-terminal thyristor device which incorporates an independent means of controlling the firing voltage and the holding current.

SUMMARY OF THE INVENTION

It is an object of this invention to provide a thyristor device having a high holding current and a stable breakover voltage characteristic.

It is another object of this invention to provide a two-terminal thyristor device having a high holding current and a stable breakover voltage characteristic.

It is another object of the invention to provide a two-terminal semiconductor switching device having a stable breakover voltage and a high holding current including a thyristor section and a field effect transistor section.

It is another object of the invention to provide a two-terminal semiconductor switching device of the type described in integrated form.

These and other objects will be made evident in the description that follows.

Briefly described, the invention is a semiconductor thyristor device having stable breakover voltage and high holding current. The device includes a thyristor section and a junction field effect transistor (JFET) section. The JFET has its source and drain connected to reverse bias the emitter-base junction of the PNP section of the thyristor when the applied voltage is less than the cut-off voltage of the JFET. When the thyristor device is in the conducting mode, the holding current thereof is approximately equal to the zero-bias channel resistance of the JFET divided by the forward biased PNP emitter-base voltage. In one embodiment a lateral PNP section and a vertical NPN section are combined with a JFET section to provide the desired device. An n-type layer is provided on a p-type substrate. A heavily doped p-type annular isolation region extending through the n-type layer to the p-type substrate provides an isolated n-type region within which the thyristor device is fabricated. An annular p-type emitter region for the PNP section is formed in the isolated n-type region, and includes the PNP base region and the JFET channel region. The annular PNP emitter region surrounds and is spaced from a second annular p-type region which forms the PNP collector and the JFET gate. Within the PNP collector region is formed an annular N+ region which forms the emitter of the vertical NPN section. The NPN emitter is spaced from the inside boundary of the annular PNP collector region. This spacing is equal to the channel length of the JFET. The channel region is the portion of the n-type isolated region immediately underlying the part of the second annular PNP region between the inner boundary thereof and the inner boundary of the N+ annular NPN emitter region formed therein. The annular PNP collector region therefore acts simultaneously as the collector of the PNP section, the base of the NPN section, and a gate of the JFET. A heavily doped n-type region is formed in the isolated n-type region surrounded by the PNP collector region, and provides ohmic contact to the drain of the JFET. A metal conductor connected to the anode terminal of the switching device contacts the PNP emitter region and also the N+ drain contact region. A second metal conductor connected to the cathode terminal contacts the annular NPN emitter region. In operation, the channel region of the JFET reverse biases the emitter-base junction of the PNP section in the forward blocking condition until the applied voltage reaches the point at which the JFET becomes pinched off. Variations in the structure include provision of a separate annular p-type isolated gate region which may be adjacent to the lateral PNP structure or which may be concentric therewith. Other variations, for planar devices, include vertical PNP sections. In such structures, an n-type substrate is used, and an isolated p-type region is formed thereon having a heavily doped n-type isolation region extending through the P region and contacting the substrate. The thyristor device is fabricated within the isolated p-type structure. In another planar embodiment, having a p-type layer on the n-type substrate, and an n-type layer on the p-type layer, an N+ isolated ring extends through both layers to the substrate, and a P+ isolation ring extends through the n-type layer to provide the isolated n-type region in which the JFET and the vertical thyristor section are fabricated. In this embodiment, an extension of the JFET gate electrode to the P+ isolation ring establishes the voltage of the gate electrode. Several mesa type structures are disclosed, with the mesa walls having heavily doped isolation regions thereon which facilitate connection of the JFET gate electrode to an underlying layer. In another embodiment, a P+ region overlies the PNP collector-base junction so that a NP+ junction determines the collector-base breakdown voltage, which then determines the thyristor device breakover voltage, while the JFET determines the holding current.

DESCRIPTION OF THE INVENTION

Figure 1:
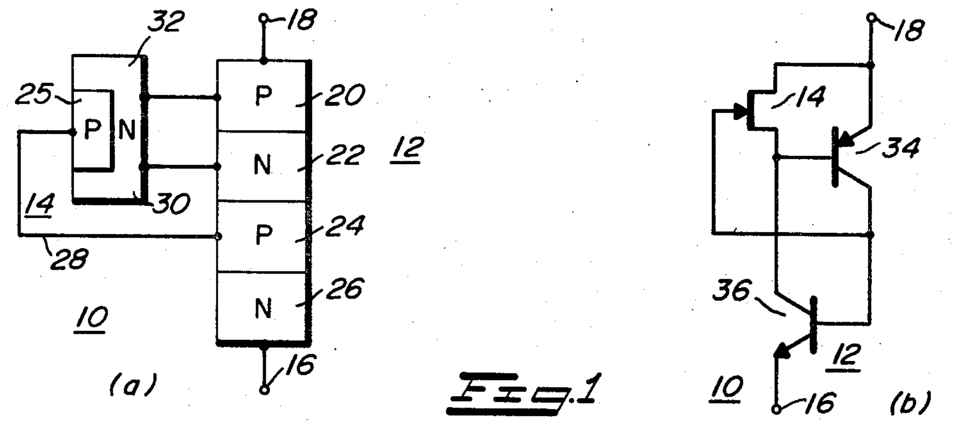
FIGS. 1*a* and 1*b* are simplified schematic diagrams of an embodiment of the invention.
Figure 2:
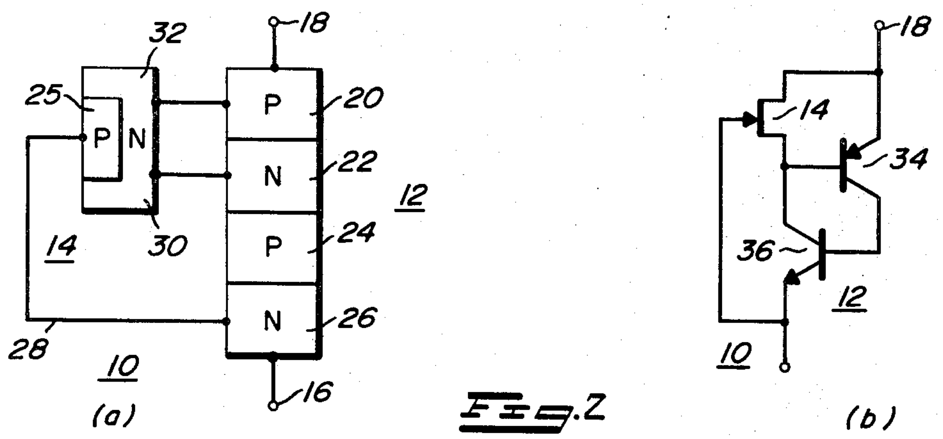
FIGS. 2*a* and 2*b* are schematic diagrams of another embodiment of the invention.

FIGS. 1*a* and 1*b* are schematic diagrams which are useful in describing the structure and operation of the invention. In FIG. 1*a* thyristor device 10 includes a thyristor 12 and a junction field effect transistor (hereinafter JFET) 14. Thyristor section 12 includes consecutive oppositely doped layers of semiconductor material including p-type layer 20, n-type layer 22, p-type layer 24 and n-type layer 26. P-type region 24 is connected to anode terminal 18, and n-type region 26 is connected to cathode terminal 16. Drain region 32 of JFET 14 is connected to p-type region 20, and source region 30 of JFET 14 is connected to n-type region 22. Gate region 25 of JFET 14 is connected to P-type region 24 by means of conductor 28. (It should be recognized that although a JFET usually has two gate electrodes, it is common to schematically represent it with a single gate electrode, as shown in FIGS. 1*a*, 1*b*, 2*a* and 2*b*.) FIG. 1*b* is another schematic drawing of the thyristor device of FIG. 1*a* using conventional circuit symbols. In FIG. 1*b* the thyristor 12 is represented as including a PNP transistor 34 and an NPN transistor 36, each transistor having its base connected to the collector of the other to form a closed internal loop having current gain equal to the current gain product of transistors 34 and 36. Thyristor section 12 switches from the forward blocking state to the conduction state when the gain product of the PNP section and the NPN section exceeds unity. Since the current gains $\beta_{PNP}$ and $\beta_{NPN}$ are both strongly current dependent at low current levels, and since in the forward blocking state the collector-base reverse leakage currents $I_{CB1}$ and $I_{CB2}$ are very low in value, and are heavily dependent on temperature and also on various processing parameters which are not easily controlled, the firing voltage (i.e., breakover voltage) of the thyristor section is quite unstable in the absence of JFET 14. Also, in the absence of the JFET as shown in FIGS. 1*a* and 1*b*, the holding current is relatively uncontrolled and is normally very low in value. In fact, the holding current may be less than the leakage current, in which case no blocking state exists. For classical four-layer diode (i.e., thyristor) structures, as shown in FIG. 1*a*, the holding current can be thought of as the current at which the common emitter current gain product $\beta_{PNP} \times \beta_{NPN}$ is equal to unity, since for lower currents the four-layer diode will revert to the forward blocking state. (The name thyristor as used hereinafter defines any semiconductor switch having bistable action which depends on PNPN regenerative feedback). The PNPN structure is best visualized as consisting of two transistors, a PNP transistor and an NPN transistor interconnected to form regenerative feedback pair, as shown in FIGS. 1*b* and 2*b*. The current gain G around the internal feedback loop is equal to $\beta_{PNP} \times \beta_{NPN}$.

The current through the thyristor is given by the equation $$I = (1 + \beta_{PNP})\,(1 + \beta_{NPN})\,(I_{CB1} + I_{CB2})/1 - (\beta_{PNP})(\beta_{NPN}) \qquad (1)$$

where $I$ is the anode current of the thyristor, $\beta_{PNP}$ is the common emitter current gain of the PNP section, $\beta_{NPN}$ is the common emitter current gain of the NPN section, $I_{CB1}$ is the collector-base reverse leakage current of the PNP section, and $I_{CB2}$ is the collector-base reverse leakage current of the NPN section. When the thyristor is in the "off" state, both $\beta_{PNP}$ and βNPN are low, and G is much less than unity. The leakage currents $I_{CB1}$ and $I_{CB2}$ increase as the voltage applied to the anode with respect to the cathode increases, and as the gain G approaches unity the circuit starts to regenerate, and each transistor section drives the opposite transistor section into saturation. For a two-terminal thyristor, the applied voltage at which the two transistor sections drive each other into saturation is called the breakover, or firing voltage. As seen from equation (1), and recognizing that the breakover voltage is the voltage at which the current $I$ increases sharply, it is seen that the breakover voltage is dependent on the current gains $\beta_{PNP}$ and $\beta_{NPN}$, and also on the leakage currents $I_{CB1}$ and $I_{CB2}$. Further, it is well known that the $\beta_{NPN}$ and $\beta_{PNP}$ are increasing functions of current, especially at low current values. It is well known that the leakage currents $I_{CB1}$ and $I_{CB2}$ are strong functions of temperature, and also of numerous processing variables. It is further known that $I_{CB1}$ and $I_{CB2}$ frequently tend to be unstable with respect to aging of the devices. For these and other reasons, it has been difficult to manufacture prior art thyristors having stable firing voltages. When the thyristor has switched into the conducting state, a minimun current, called the "holding current" is required to prevent the device from reverting to the forward blocking state, or "open" state. The holding current is generally very low, and is heavily temperature dependent and unstable with regard to processing variables and device aging. However, for some applications, high, stable holding currents are required. The ideal thyristor device for such applications should have stable, specified values of breakover voltage and holding current. The two-terminal thyristors in the prior art have not had such desirable characteristics. The problem of realizing such devices hinges on the fact that the firing voltage depends on the breakdown voltage of the blocking junction (i.e., the PNP collector-base junction) together with the current gains of both end sections, while the holding current depends on the current dependent, temperature dependent current gains of both transistor sections. It has been extremely difficult to achieve proper control by simultaneous convergence of all of the aforementioned variables. It is difficult to control the current at which the gain product G is unity for prior art devices. One approach to increasing the holding current has been to provide low gain transistor sections; for example a lateral PNP transistor section with relatively low current gain $\beta$ can be provided. However, it is very difficult to control the current gain, so providing low gain devices is not a feasible solution to the problem of obtaining a thyristor with a stable, high value of holding current. Another approach to obtaining high holding current values has involved use of resistive shunts, but obtaining uniform values has been difficult. Another approach to increasing the holding current that has been gold doping the base regions in the thyristor structures to reduce the gain. Again, the result has been relatively unreproducible.

In the device illustrated in FIG. 1*a*, the firing characteristic and also the holding current may be controlled by the characteristics of the JFET, rather than by properties of the current gain of the PNP and NPN sections and of the leakage currents therein. In the embodiments of FIG. 1*a*, 1*b*, 2*a* and 2*b* the holding current is essentially equal to the zero-bias channel resistance of the JFET divided by the PNP emitter-base forward voltage drop, and the breakover voltage of thyristor device 10 is the value of applied anode-to-cathode voltage at which JFET 14 is pinched off.

The embodiment shown in FIGS. 2*a* and 2*b* differs from that shown in FIGS. 1*a* and 1*b* only in that the gate region 26 of JFET 14 contacts n-type region 26 (or cathode terminal 16) by means of conductor 28. For certain structures, one embodiment or the other may prove advantageous. However, with respect to stability of the breakover voltage of the switching device 10, the embodiment of FIG. 2*b* is superior, because the temperature variation of the forward biased PN junction formed by regions 24 and 26 is eliminated. Since the voltage at which the JFET is pinched-off does not ordinarily vary greatly with temperature, this may provide a significant improvement in the stability of the breakover voltage. (It should be recognized that in a JFET, as the magnitude of the drain voltage increases, eventually the two depletion regions associated with the p-type gate electrodes at the drain end approach very close to one another such that any further increment in drain voltage results in essentially no further increase in drain current. This is called a saturation condition, and the gate-drain voltage at which it occurs is called the pinch-off voltage, and the constant current is called the pinch-off current. This should not be confused with the voltage at which the channel is completely pinched-off, (the cut-off voltage $V_{co}$ resulting in zero drain current). However, it should be noted that since the cut-off voltage $V_{co}$ increases with temperature, either the embodiment of FIGS. 1*a* and 1*b* or the embodiment of FIGS. 2*a* and 2*b* may prove superior, depending on whether $(dV_{co}/dT)$ is between 0 and ½ $(dV_{BE}/dT)$ or between ½ $(dV_{BE}/dT)$ and $(dV_{BE}/dT)$, where $(dV_{BE}/dT)$ is the incremental change in the forward biased voltage of the PN junction formed by regions 24 and 26 with respect to temperature.

Figure 3:
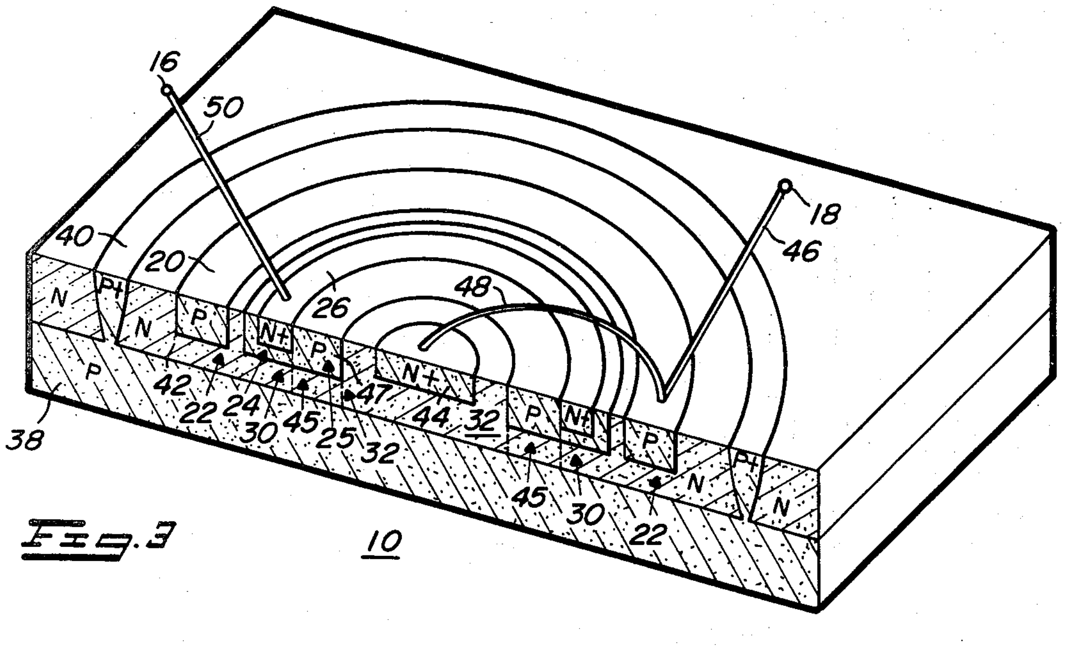
FIGS. 3–10 are perspective representations of several embodiments of the invention.

FIG. 3 depicts an embodiment of the invention suitable for inplementation in integrated circuits. The switching device 10 is fabricated on a p-type substrate 38. An n-type layer is provided on a surface of substrate 38, and an annular heavily doped p-type isolation region 40 extends through the n-type layer to substrate 38, thereby providing isolated n-type region 42. A heavily doped n-type region 44 is provided within the exposed surface of n-type region 42. An annular p-type region 46 surrounding and spaced from N+ region 44 is also provided within the exposed surface of n-type region 42. A heavily doped n-type annular region 26 is provided within the exposed surface of p-type region 46. A second annular p-type region 20 surrounding and spaced from p-type region 46 is also provided within the exposed surface of isolated n-type 42. The embodiment shown in FIG. 3 corresponds to the diagram in FIG. 1*a*, and the reference numerals used in FIG. 1*a* are retained to indicate the corresponding regions in FIG. 3. Annular p-type region 20 in FIG. 3 is the emitter of the PNP section. Isolated n-type region 42 includes a region 22 which functions as the base of the PNP section. p-type region 46 includes section 25, which functions as the gate electrode of JFET 14 (FIG. 1*a*) and also includes region 24, which simultaneously functions as the NPN base region. The portion of n-type region 42 which directly underlies gate region 26 is the channel region 45. The drain region of JFET 14 is indicated by reference numeral 32, and the source region is indicated by reference numeral 30. Anode terminal 18 is connected to PNP emitter region 20 by means of conductor 47, and the drain region 32 electrically contacts PNP emitter region 20 by means of N+ drain contact region 44 and conductor 48. NPN emitter region 26 contacts cathode terminal 16 by means of conductor 50.

The device 10 shown in FIG. 3 has its gate electrode effectively connected to the base of the NPN section, and so the temperature dependence of the forward biased emitter base junction is added to the temperature dependence of the cut-off voltage of the JFET, and therefore also to the firing voltage of the thyristor device. Once the switching device switches to the conducting mode, the conductivity of the channel region 45 will be modulated by carriers in the NPN collector region 22. The conductivity modulation results if the channel region is located within a diffusion length of injected carriers. Since the channel region 45 is located close to the NPN structure, a significant amount of conductivity modulation will occur, resulting in an increase in the holding current of thyristor device 10. The p-type emitter for the lateral PNP in FIG. 3 has poor efficiency until the JFET is pinched-off. However, once conduction starts, conductivity modulation assures a low value for channel resistance, even if the JFET is quite small.

Figure 4:
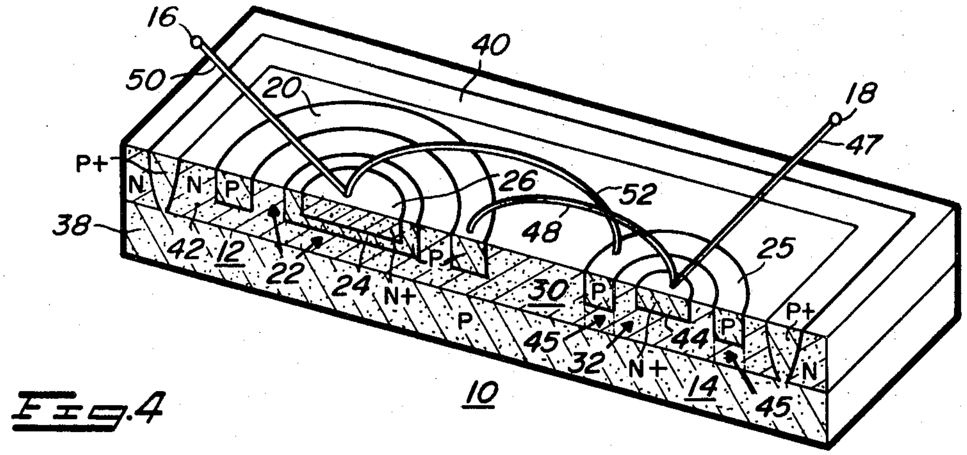

Another configuration which provides a more stable firing voltage with respect to temperature is shown in FIG. 4. Thyristor device 10 shown in FIG. 4 corresponds to the structure shown in FIGS. 2*a* and 2*b*, wherein the temperature dependence of the NPN emitter-base forward voltage is eliminated. In FIG. 4, the JFET structure 14 is located at a distance from the thyristor section 12, as opposed to the structure of FIG. 3, wherein the JFET structure is concentric with the lateral PNP and vertical NPN sections. The gate electrode 25 of JFET 14 is annular p-type region formed within the surface of n-type region 42. Annular gate region 25 surrounds and is spaced from heavily doped n-type drain contact region 44. Thyristor section 12 of thyristor device 10 includes p-type region 24, heavily doped n-type region 26, and annular p-type region 20. n-type region 42 includes region 22 which simultaneously functions as the PNP base region and the NPN collector region. Region 24 simultaneously functions as the PNP collector and the NPN base. Region 20 functions as the PNP emitter and is essentially concentric with region 24. It should be noted, however, the JFET section 14 is not concentric with thyristor section 12. Anode terminal 18 is connected to drain contact region 44 and PNP emitter region 20 by means of conductors 47 and 48, respectively. Cathode terminal 16 is connected to NPN emitter region 26 and gate electrode 25 by means of conductors 50 and 52, respectively. For this embodiment, the channel region 44 of JFET 14 is not significantly modulated by injected carriers in the thyristor 12, so that holding current will be low. However, this may be overcome by locating the PNP and the NPN sections close to the JFET structure (i.e., within a diffusion length thereof) so that conductivity modulation of the channel region 45 occurs, as in FIG. 5.

Figure 5:
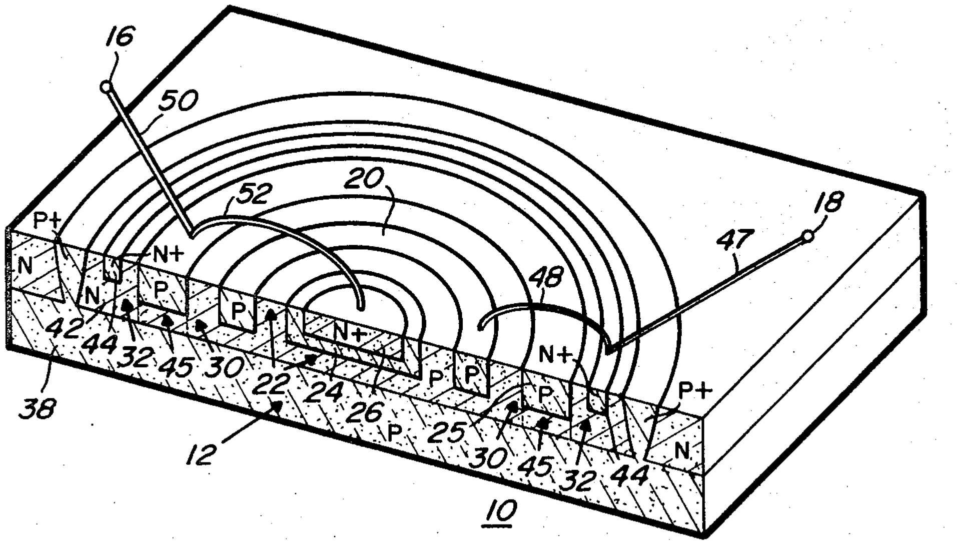

The embodiment shown in FIG. 5 corresponds to the schematic diagram of FIG. 1*b*. The thyristor section in FIG. 5 is similar to that of FIG. 4, but the JFET structure is concentric with and surrounds the thyristor section. Gate electrode 25 is a p-type annular ring formed in isolated n-type region 42 surrounding and spaced from PNP emitter region 20. N+ type drain contact region 44 surrounds gate electrode 25. This structure provides a larger width-to-length ratio than the structure of FIG. 4, and also provides increased conductivity modulation in the channel region 45, thus providing higher holding current.

Figure 6:
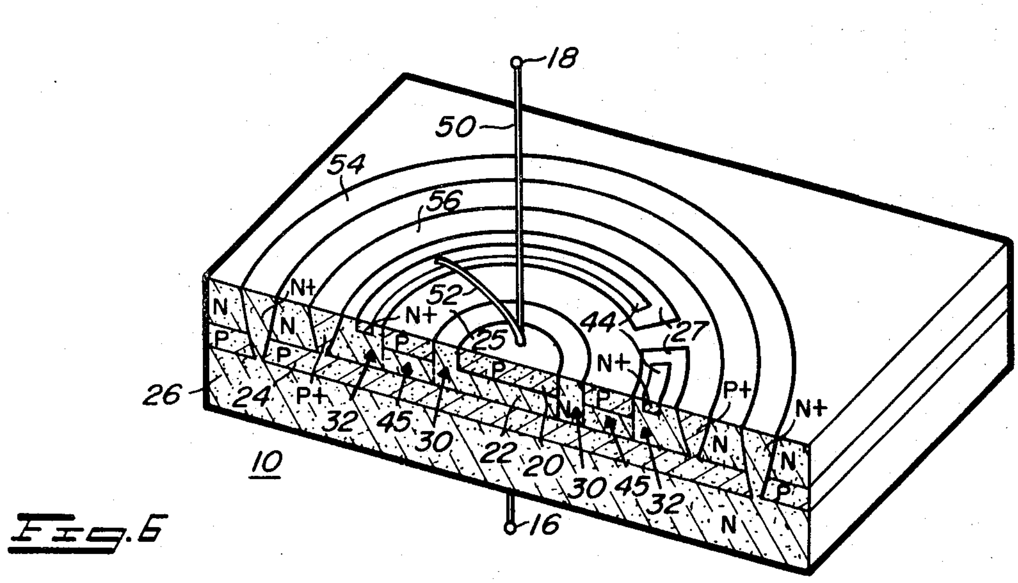

FIG. 6 is a profile diagram of an embodiment having the equivalent circuit shown in FIG. 1*a*. Both the PNP section and the NPN section are vertical-type devices in this structure. The n-type substrate 26 functions as the NPN emitter, and is connected to cathode terminal 16. A p-type layer is formed on a surface of substrate 26, and an n-type layer is formed on the surface of the p-type layer. An annular heavily doped n-type isolation region 54 extends through both the n-type layer and the p-type layer and joins n-type substrate 26, providing an isolated region 24 of the p-type layer. Region 24 functions as the NPN base region. An annular heavily doped p-type isolation ring 56 extends through the n-type layer and joins region 24, thereby providing isolated n-type region 22, which functions as the PNP base, the NPN collector, and also contains the channel region 45. A p-type region 20 within the surface of n-type region 22 functions as the PNP emitter region, and is surrounded by annular p-type region 25, which is formed within the surface of region 22 and functions as the gate electrode of JFET 14. Gate electrode 25 has a relatively narrow, p-type protrusion 27 extending outward therefrom and joining p-type isolation region 56, thereby electrically connecting gate electrode 25 to p-type region 24. Heavily doped n-type region 44 is formed within the surface of n-type region 22 between gate region 25 and isolation region 56, and functions as the drain contact electrode.

Figure 7:
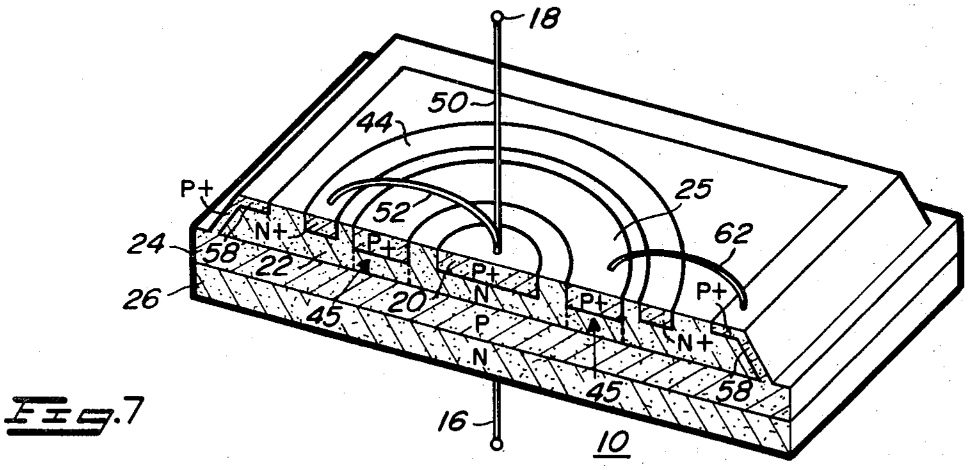

Another structure having the equivalent circuit of FIG. 1*a* is shown in FIG. 7. The thyristor device 10 in FIG. 7 has a mesa-type structure. The n-type substrate 26 serves as the NPN emitter region. A p-type layer 24 on n-type region 26 functions as the NPN base and also as the PNP collector. n-type region 22 is formed on region 24, and has a mesa-like structure. A heavily doped p-type region 58 is formed within the exposed surface of region 22 along the sloping edges of the mesa-type region 22 and adjoins p-type layer 24 and also extends for a distance along the top planar surface of region 22. Heavily doped p-type region 20 functions as the PNP emitter, and is surrounded by annular p-type region 25. n-type region 22, functions as the PNP base. Regions 20 and 25 are formed within the exposed surface n-type region 22. Region 25 functions as the JFET gate electrode. A heavily doped n-type annular ring 44 formed within the surface of region 22 surrounds region 25 and functions as the drain contact region. JFET gate electrode 25 is connected to conductor 62, which is also connected to P+ region 58, which in turn is connected to p-type layer 24.

Figure 8:
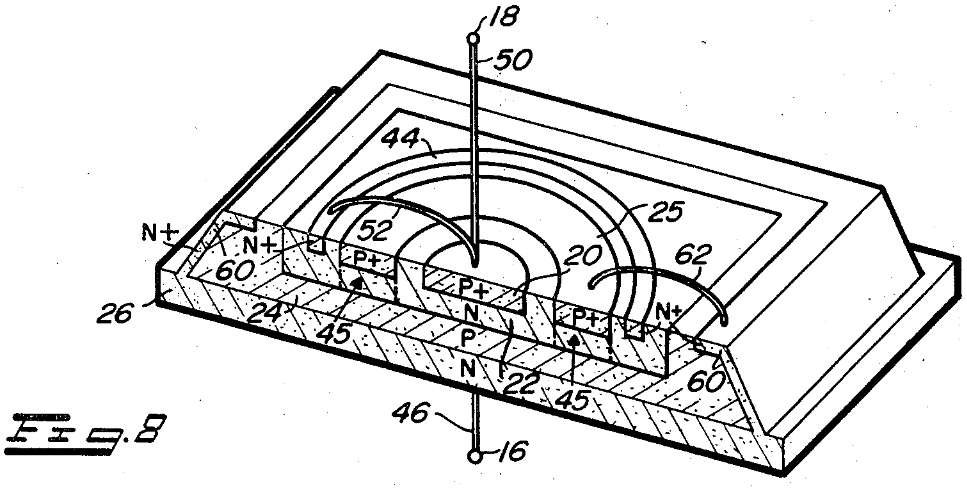

A mesa-type device having the equivalent circuit of FIG. 2*a* is shown in FIG. 8. The n-type substrate 26 serves as the NPN emitter region. A mesa-type p-type layer 24 on n-type region 26 functions as the NPN base and also as the PNP collector. n-type region 22 is formed within the surface of region 24. A heavily doped n-type region 60 is formed within the exposed surface of region 4 along the sloping edges thereof, adjoins p-type layer 24 and also extends for a distance along he upper planar surface of region 24. The remaining portions of FIG. 8 are identical to the corresponding portions of FIG. 7, except that conductor 62 contacts N+ region 60 rather than P+ region 58.

Figure 9:
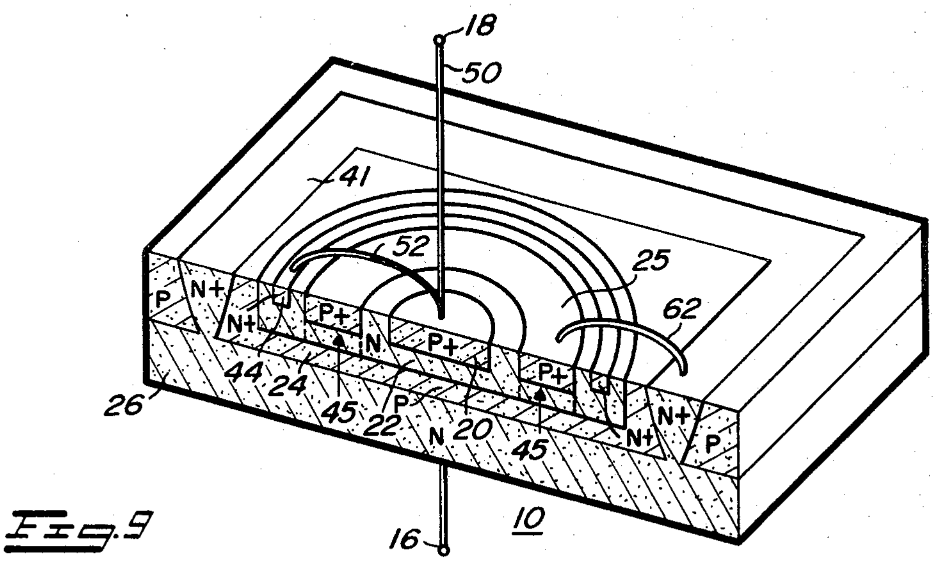

FIG. 9 is a profile diagram of a planar switching device 10 having vertical PNP and NPN sections. n-type substrate 26 functions as the NPN emitter. A p-type layer provided on region 26 has therein a heavily doped n-type isolation region 41 which extends through the p-type layer to join region 26 forming an isolated n-type region 24. Region 22, formed within the surface of region 24, functions as the PNP base and also includes the channel region of the JFET. Heavily doped p-type region 20 is formed within the surface of region 22 and functions as the PNP emitter, and is surrounded by heavily doped p-type annular region 25, which functions as the JFET gate electrode, and is surrounded by heavily doped n-type annular ring 44 which functions as the drain contact region. Gate electrode 25 is connected to the NPN emitter region by means of conductor 62 which contacts both region 25 and isolation region 41. The JFET drain region is connected to the anode terminal 18 by means of conductors 52 and 50.

Figure 10:
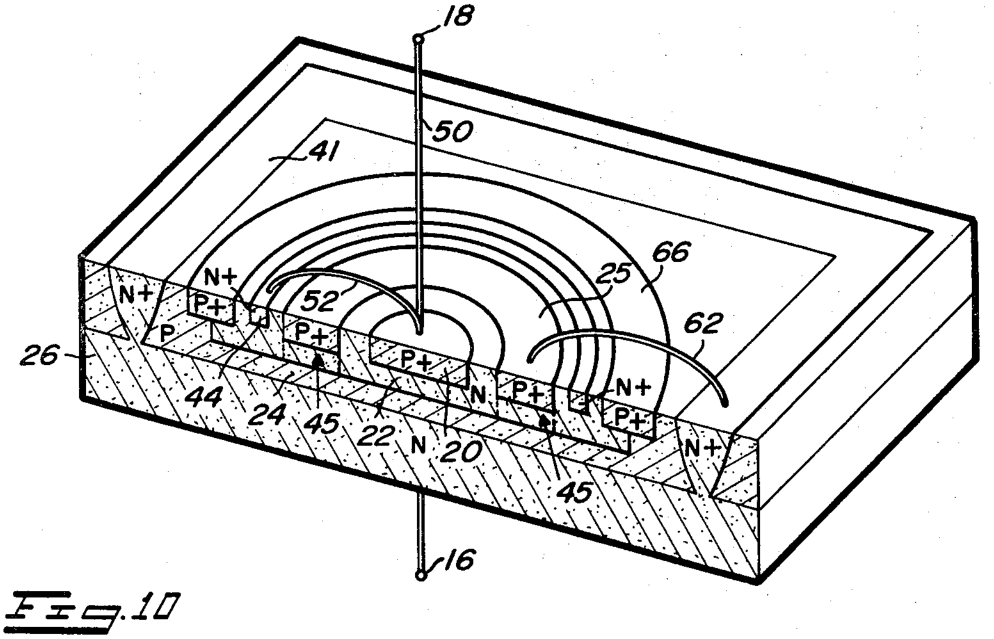

A variation of the structure illustrated in FIG. 9 is shown in the diagram in FIG. 10, and is similar to the device of FIG. 9 except for the addition of annular heavily doped p-type region 66, which is formed in the upper surface of regions 22 and 24 to prevent the PN junction formed thereby from terminating at the upper surface. As a result, in the breakdown voltage of the PNP collector base junction is mainly determined by the doping level of the P+ material of region 66. The purpose of providing the NP+ junction is to provide a precisely controlled breakdown voltage in the range from approximately 5 to 10 volts that is easily controlled using conventional manufacturing techniques. the JFET may not be cut-off until the applied voltage is several volts higher than the PNP collector-base breakover voltage. In this embodiment, a low firing current is sacrificed somewhat in order to achieve increased stability of the breakover voltage of the thyristor device 10.

It should be appreciated that the various embodiments described herein may have firing voltages in the range from 5–50 volts or more. However, the lower firing voltages are difficult to obtain using conventional manufacturing processes, since it is more difficult to control multiplication at lower voltages. This is because it is difficult to manufacture PN junctions having breakdown voltages lower than 10 volts, since by the time the complete device is fabricated, several high temperature diffusion cycles may have occurred, and a certain amount of grading of the PN junctions may have occurred. Therefore it is harder to control the multiplication factor. It is much easier to produce controllable breakdown voltages at higher voltages.

Although this invention has been illustrated and described in relation to several specific embodiments thereof, those skilled in the art will readily recognize that variations in placement of parts may be made to suit specific requirements without departing from the spirit and scope of the invention.

What is claimed is:

1. A thyristor having first and second terminals including a thyristor having first, second, third and fourth regions of semiconductor, said first region being adjacent said second region, said second region being adjacent said third region, and said third region being adjacent said fourth region, said first and third regions being of a first conductivity type and said second and fourth regions being of a second conductivity type comprising:

a junction field effect transistor for controlling the firing voltage and the holding current of said thyristor circuit having main electrodes connected, respectively, to said first region and said second region, and having a gate electrode connected to a bias voltage conductor wherein said bias voltage conductor is connected to one of said third region and said fourth region.

2. A semiconductor device including a first region of semiconductor of first conductivity type, a second region of semiconductor of a second conductivity type forming a first junction with said first region, a third region of semiconductor of said first conductivity type forming a second junction with said second region, and a fourth region of semiconductor of said second conductivity type forming a third junction with said third region, said first region being adapted to be coupled to a first terminal and said fourth region being adapted to be coupled to a second terminal comprising a junction field-effect transistor for controlling the firing voltage and the holding current of said semiconductor device within said second region, said junction field-effect transistor including a channel region in said second region and a gate electrode adjacent said channel region for controlling current in said channel region, said gate electrode being formed by a fifth region of said first conductivity type within said second region, one end of said channel region being coupled to said first region and the other end being continuous with said second region, said gate electrode being connected to conductive bias means coupled to said semiconductor device wherein said conductive bias means is coupled to one of said third region and said fourth region.

3. The semiconductor device as recited in claim 2 wherein said channel region is located within a diffusion length of said first junction.

4. The semiconductor device as recited in claim 2 wherein said channel region is located within a diffusion length of said third junction.

5. The semiconductor device as recited in claim 2 wherein said fifth region is formed within said second region at a major surface thereof, said fifth region spaced from and completely surrounding said first region.

6. The semiconductor device as recited in claim 2 wherein said fifth region is formed within said second region at a major surface thereof, said fifth region spaced from and completely surrounding a sixth region of said second conductivity type, said sixth region being formed in said second region at said major surface.

7. The semiconductor device as recited in claim 2 wherein said fifth region and said third region are continuous, both being formed in said second region at a major surface of said second region.

* * * * *